US006987285B2

(12) United States Patent
Nagashima et al.

(10) Patent No.: US 6,987,285 B2

(45) Date of Patent: Jan. 17, 2006

(54) SEMICONDUCTOR LIGHT EMITTING DEVICE IN WHICH HIGH-POWER LIGHT OUTPUT CAN BE OBTAINED WITH A SIMPLE STRUCTURE INCLUDING INGAASP ACTIVE LAYER NOT LESS THAN 3.5 MICRONS AND INGAASP AND INP CLADDING

(75) Inventors: Yasuaki Nagashima, Atsugi (JP); Yoshiharu Shimose, Atsugi (JP); Atsushi Yamada, Atsugi (JP); Tomoyuki Kikugawa, Atsugi (JP)

(73) Assignee: Anritsu Corporation, Atsugi (JP)

(*) Notice: Subject to any disclaimer, the term of this patent is extended or adjusted under 35 U.S.C. 154(b) by 0 days.

(21) Appl. No.: 10/692,125

(22) Filed: Oct. 23, 2003

(65) Prior Publication Data

US 2004/0089866 A1 May 13, 2004

(30) Foreign Application Priority Data

Nov. 1, 2002 (JP) ............................. 2002-319676

(51) Int. Cl.

*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............................ 257/79; 257/82; 257/85; 257/94; 372/43

(58) Field of Classification Search .................. 257/79, 257/82, 85, 94; 372/45, 47, 43
See application file for complete search history.

(56) References Cited

U.S. PATENT DOCUMENTS 5,331,655 A * 7/1994 Harder et al. ................. 372/45

(Continued)

FOREIGN PATENT DOCUMENTS

EP 0 448 406 A2 9/1991

(Continued)

OTHER PUBLICATIONS

Kawanaka, S. et al. "Strained Single Quantum Well AlGaInP Laser Diodes with an Asymmetric Waveguiding Layer." Extended Abstracts of the International Conference on Solid State Devices and Materials, Japan Society of Applied Physics. Tokyo, Japan, Aug. 1, 1992, pp. 240-242, XP000312208.

*Primary Examiner*—William M. Brewster
(74) *Attorney, Agent, or Firm*—Frishauf, Holtz, Goodman & Chick, P.C.

(57) ABSTRACT

The semiconductor light emitting device includes a semiconductor substrate formed from InP, an active layer, an n-type cladding layer formed from InGaAsP, and a p-type cladding layer formed from InP. The active layer is formed at the upper side of the semiconductor substrate. The n-type cladding layer and the p-type cladding layer are formed so as to hold the active layer therebetween. The semiconductor light emitting device is, given that, a refractive index of the n-type cladding layer is na, and a refractive index of the p-type cladding layer is nb, set so as to be the relationship of na>nb in which the refractive index na of the n-type cladding layer is higher than the refractive index nb of the p-type cladding layer, and due to the distribution of light generated by the active layer being deflected to the n-type cladding layer side, optical loss by intervalence band light absorption at the p-type cladding layer is suppressed, and high-power light output can be obtained.

17 Claims, 7 Drawing Sheets

U.S. PATENT DOCUMENTS

| | | | | |
|---|---|---|---|---|
| 5,920,079 | A * | 7/1999 | Shimizu et al. | 257/18 |
| 6,167,073 | A | 12/2000 | Botez et al. | 372/46.01 |
| 6,175,582 | B1 | 1/2001 | Naito et al. | 372/45.01 |
| 6,285,694 | B1 | 9/2001 | Shigihara | 372/45.01 |
| 6,650,671 | B1 | 11/2003 | Garbuzov et al. | 372/45 |

FOREIGN PATENT DOCUMENTS

| | | | |
|---|---|---|---|
| EP | 0 920 097 | A2 | 6/1999 |
| JP | 55-80388 | * | 6/1980 |
| JP | 2000-174394 | A | 6/2000 |
| WO | WO 01/57974 | A1 | 8/2001 |

* cited by examiner $$\begin{cases} n_s - n1 = n1 - n2 = n2 - n3 = n3 - n_b > n3 - n_a \\ t1 < t2 < t3 \end{cases}$$

$$\begin{cases} n_s - n1 > n1 - n2 > n2 - n3 > n3 - n_b > n3 - n_a \\ t1 < t2 < t3 \end{cases}$$

SEMICONDUCTOR LIGHT EMITTING DEVICE IN WHICH HIGH-POWER LIGHT OUTPUT CAN BE OBTAINED WITH A SIMPLE STRUCTURE INCLUDING INGAASP ACTIVE LAYER NOT LESS THAN 3.5 MICRONS AND INGAASP AND INP CLADDING

CROSS-REFERENCE TO RELATED APPLICATIONS

This application is based upon and claims the benefit of priority from the prior Japanese Patent Application No. 2002-319676, filed Nov. 1, 2002, the entire contents of which are incorporated herein by reference.

BACKGROUND OF THE INVENTION

1. Field of the Invention

The present invention relates to a semiconductor light emitting device, and in particular, to a semiconductor light emitting device using a technique in which high-power light output can be obtained with a simple structure.

2. Description of the Related Art

As broadly known, a light signal used for an optical communication system is transmitted in an optical fiber underlaid over a long distance.

Therefore, a high-power light output characteristic and high stability characteristic are required for a semiconductor laser, which is a semiconductor light emitting device used as a light source generating the light signal in the optical communication system as described above.

FIG. 12 is a perspective view for explanation of a structure of a conventional semiconductor laser 10 considered in order to obtain a high-power light output characteristic.

FIG. 13 is a cross sectional view of a main portion of the semiconductor laser 10 shown in FIG. 12.

As shown in FIG. 12, in the semiconductor laser 10, on a semiconductor substrate 11 formed from n-type InP (indium phosphor), an n-type cladding layer 12 formed from n-type InP, a first SCH (Separate Confinement Heterostructure) layer 13 formed from InGaAsP (indium gallium phosphor), an active layer 14 formed from InGaAsP, and a second SCH layer 15 formed from InGaAsP are successively formed.

Note that, the n-type cladding layer 12, the first SCH layer 13, the active layer 14, and the second SCH layer 15 are formed to be a mesa type.

A first buried layer (lower buried layer) 16 formed from p-type InP and a second buried layer (upper buried layer) 17 formed from n-type InP are formed at the both sides of the respective layers formed to be a mesa type.

A p-type cladding layer 18 formed from p-type InP is formed at the upper side of the second SCH layer 15 and the top surface of the upper buried layer 17.

A p electrode 20 is provided at the top surface of a p-type contact layer 19 formed at the top surface of the p-type cladding layer 18.

Further, an n electrode 21 is provided at the bottom surface of the semiconductor substrate 11.

As the active layer 14, a bulk structure structured from one uniform material may be used.

However, here, in order to realize a good light oscillation characteristic as the semiconductor laser 10, as shown in FIG. 13, an MQW (Multi-quantum well) structure, in which a plurality of well layers 14*a* and a plurality of barrier layers 14*b* positioned at the both sides of the respective well layers 14*a* are alternately formed, is used as the active layer 14.

Moreover, a multilayer structure formed from a plurality of layers 13*a*, 13*b*, and 13*c* is used as the first SCH layer 13 positioned at the lower side of the active layer 14 having the MQW structure.

In the same way, a multilayer structure formed from a plurality of layers 15*a*, 15*b*, and 15*c* is used as the second SCH layer 15 positioned at the upper side of the active layer 14.

Respective refractive indices n, with respect to the light generated by the active layer 14, of the respective layers of the n-type cladding layer 12, the first SCH layer 13 formed from the plurality of layers 13*a*, 13*b*, and 13*c*, the active layer 14 having the MQW structure in which the plurality of well layers 14*a* and the plurality of barrier layers 14*b* are included, the second SCH layer 15 formed from the plurality of layers 15*a*, 15*b*, and 15*c*, and the p-type cladding layer 18, are set so as to be the characteristics of the refractive indices as shown in FIG. 14.

Namely, the refractive index of the active layer 14 at the center is set to the highest, and the refractive indices of the respective cladding layers 12, 18 at the both sides are set so as to be equal to one another and to the lowest amount those of the layers.

Then, the refractive indices of the plurality of layers 13*a*, 13*b*, 13*c*, and 15*a*, 15*b*, 15*c* of the first SCH layer 13 and the second SCH layer 15 are respectively set so as to be gradually lower.

In this way, the refractive indices as the entire semiconductor laser 10 are set so as to have the characteristic of the refractive indices which is vertically symmetrical (FIG. 14) with respect to the active layer 14 serving as the center.

When a predetermined direct voltage is applied between the p electrode 20 and the n electrode 21 of the semiconductor laser 10 having such a characteristic of the refractive indices, light P having power corresponding to the current region is thereby generated at the active layer 14.

Further, the light P generated at the active layer 14 is emitted to the exterior from both end surfaces (facet) 22*a* and 22*b* of the semiconductor laser 10 shown in FIG. 12.

Note that, in the semiconductor laser 10, due to the refractive index of the active layer 14 being set to be higher than the refractive indices of the respective cladding layers 12 and 18, other than the fact that some of the light P generated at the active layer 14 are leaked to the respective cladding layers 12 and 18, an optical waveguide path for preventing dissipation is formed.

In accordance therewith, it is anticipated that the semiconductor laser 10 in which high-power light output can be obtained at a high current region is realized.

However, in the semiconductor laser 10, because the characteristic of the refractive indices is vertically symmetrical with respect to the active layer 14 serving as the center, the distribution of the light P generated at the active layer 14 is vertically symmetrical with respect to the active layer 14 serving as the center.

Therefore, the distributions of the light P leaked to both the cladding layers 12 and 18 are the same, and the quantity of optical loss by intervalence band absorption on the basis of the distribution of light in the p-type cladding layer 18 cannot be avoided, and the light output as the semiconductor laser 10 is reduced by the quantity of optical loss.

Further, because the electrical resistance of the p-type cladding layer 18 is relatively high, the heating value by the p-type cladding layer 18 at a high current region is made large, which means the light output as the semiconductor laser 10 is reduced.

Accordingly, it is difficult to realize the semiconductor laser 10 in which high-power light output can be obtained at a high current region.

Note that, in order to make the light output of the semiconductor laser 10 having such a structure have much higher power, the first SCH layer 13 and the second SCH layer 15 which respectively have intermediate refractive indices are intervened between the active layer 14 and both the cladding layers 12, 18.

Namely, in accordance therewith, the carriers which are injected can be concentrated in the vicinity of the active layer 14, and at this time, because the carriers and light are simultaneously concentrated at the same region in the vicinity of the active layer 14, the luminous efficiency as the semiconductor laser 10 is high.

Further, in order to make the light output of the semiconductor laser 10 having such a structure have high power, it is effective that an attempt is made to reduce the optical confinement coefficient to the first SCH layer 13, the second SCH layer 15, and the active layer 14.

However, when the optical confinement coefficient to the first SCH layer 13, the second SCH layer 15, and the active layer 14 are lowered, due to the components of the light passing through both the cladding layers 12 and 18 increasing, another problem arises.

In other words, in accordance with the fact that the components of the light passing through the both cladding layers 12 and 18 increases, it is necessary to increase the thickness of both the cladding layers 12 and 18.

However, at the p-type cladding layer 18, as described above, because the electrical resistance is relatively high, the electrical resistance of the entire element is increased due to the increase of the p-type cladding layer 18, and the heating value of the element at the high-current region is made large, making it difficult to make the light output of the semiconductor laser 10 have much higher power.

Moreover, if the distribution of light in the p-type cladding layer 18 among both the cladding layers 12 and 18 is increased, the quantity of optical loss by intervalence band light absorption described above increases.

The increase of the quantity of optical loss by intervalence band light absorption can be prevented due to the p-type impurity concentration of the p-type cladding layer 18 being made small.

However, if the p-type impurity concentration of the p-type cladding layer 18 is made small, due to the electrical resistance of the entire element including the p-type cladding layer 18 further increasing, high-power light output cannot be obtained as the semiconductor laser 10.

As a method for solving the problem of the optical loss by intervalence band light absorption, as shown in FIG. 15, a technique in which, due to an optical field control layer 23 having a refractive index which is higher than the refractive index of the n-type cladding layer 12 and is close to the refractive index of the active layer 14 being provided in the n-type cladding layer 12, the distribution of light is shifted to the n-type cladding layer 12 side, and the quantity of light distributed in the p-type cladding layer 18 is reduced, is disclosed in Jpn. Pat. Appln. KOKAI Publication No. 2000-174394 which is Patent Document.

However, in this way, if the optical field control layer 23 having the refractive index close to the refractive index of the active layer 14 is provided in the n-type cladding layer 12, not only is the structure complicated, but also a new problem arises.

Namely, because the optical field control layer 23 as described above has the same structure as that of the active layer 14, when the optical field control layer 23 is provided at a position far away from the first SCH layer 13, another optical waveguide path is formed, and due to the distribution of light being made to be the double-humped characteristic, the operation as the semiconductor laser 10 is made unstable.

Accordingly, the optical field control layer 23 must be provided in the vicinity of the first SCH layer 13.

However, if the optical field control layer 23 whose refractive index is high is provided in the vicinity of the first SCH layer 13, due to the equivalent refractive indices of the entire waveguide path being made high, an oscillation mode of the semiconductor laser 10 is easily displaced from a desired single mode to a lateral high-order mode.

Further, the displacement to the lateral high-order mode can be prevented by making the width of the region including the active layer 14, the first SCH layer 13, and the second SCH layer 15 narrow.

However, if the width of the region including the active layer 14, the first SCH layer 13, and the second SCH layer 15 is made narrow, the increases of the electrical resistance and the thermal resistance of the entire element are bought about, and the luminous efficiency of the semiconductor laser 10 is more decreased.

BRIEF SUMMARY OF THE INVENTION

An object of the present invention is to provide a semiconductor light emitting device in which high-power light output can be obtained with a simple structure.

Another object of the present invention is to provide a semiconductor light emitting device in which, even when the optical confinement coefficient to an active layer is lowered, high-power light output can be obtained with a simple structure, and a mode displacement is hard to arise.

In order to achieve the above object, according to a first aspect of the present invention, there is provided a semiconductor light emitting device comprising:

a semiconductor substrate (11) formed from InP;

an active layer (14) formed at the upper side of the semiconductor substrate; and an n-type cladding layer (32) formed from InGaAsP and a p-type cladding layer (18) formed from InP, which are formed so as to hold the active layer therebetween, wherein, the semiconductor light emitting device is, given that a refractive index of the n-type cladding layer is na, and a refractive index of the p-type cladding layer is nb, set so as to be the relationship of na>nb in which the refractive index na of the n-type cladding layer is higher than the refractive index nb of the p-type cladding layer, and due to the distribution of light generated by the active layer being deflected to the n-type cladding layer side, optical loss by intervalence band light absorption at the p-type cladding layer is suppressed, and high-power light output can be obtained.

In order to achieve the above object, according to a second aspect of the present invention, there is provided a semiconductor light emitting device according to the first aspect, wherein the semiconductor light emitting device further comprises:

a first SCH (Separate Confinement Heterostructure) layer (13) formed from InGaAsP, which is formed between the active layer and the n-type cladding layer; and a second SCH layer (15) formed from InGaAsP, which is formed between the active layer and the p-type cladding layer.

In order to achieve the above object, according to a third aspect of the present invention, there is provided a semiconductor light emitting device according to the first aspect, wherein the active layer includes a bulk structure structured from one uniform material.

In order to achieve the above object, according to a fourth aspect of the present invention, there is provided a semiconductor light emitting device according to the first aspect, wherein the active layer includes a plural-layer MQW (Multi-quantum well) structure having plural-layer well layers (14*a*) and plural-layer barrier layers (14*b*) positioned at the both sides of the respective well layers at the plural-layer well layers.

In order to achieve the above object, according to a fifth aspect of the present invention, there is provided a semiconductor light emitting device according to the second aspect, wherein the first SCH layer includes a multilayer structure formed from a plurality of layers (13*a*, 13*b*, 13*c*, . . . , 13N), and the second SCH layer includes a multilayer structure formed from a plurality of layers (15*a*, 15*b*, 15*c*, . . . , 15N).

In order to achieve the above object, according to a sixth aspect of the present invention, there is provided a semiconductor light emitting device according to the fifth aspect, wherein, given that a refractive index of a layer having the lowest refractive index of the plurality of layers structuring the active layer is ns, and refractive indices and thickness of the plurality of layers of the first SCH layer are respectively n1, n2, n3, . . . , nN and t1, t2, t3, . . . , tN at order close from the active layer and refractive indices and thickness of the plurality of layers of the second SCH layer are respectively n1, n2, n3, . . . , nN and t1, t2, t3, . . . , tN at order close from the active layer, the relationship of the thickness of the respective layers is set to be $$t1=t2=t3=, \ldots, =tN,$$

the relationship of the magnitudes of the refractive indices of the respective layers is set to be the relationship:

$$ns>n1>n2>n3>, \ldots, >nN>na>nb$$

such that the refractive indices become smaller the further away from the active layer including the relationship that the refractive index ns of the active layer is the highest, and the refractive index na of the n-type cladding layer is higher than the refractive index nb of the p-type cladding layer, and the refractive index differences between the layers which are adjacent to one another in the plurality of layers respectively structuring the first SCH layer and the second SCH layer are set to be the relationship:

$$ns-n1>n1-n2>n2-n3>, \ldots, >nN-nb>nN-na$$

such that the refractive index differences become smaller the further toward the n-type cladding layer and the p-type cladding layer from the active layer.

In order to achieve the above object, according to a seventh aspect of the present invention, there is provided a semiconductor light emitting device according to the fifth aspect, wherein, given that a refractive index of a layer having the lowest refractive index of the plurality of layers structuring the active layer is ns, the refractive indices and the thickness of the plurality of layers of the first SCH layer are respectively n1, n2, n3, . . . , nN and t1, t2, t3, . . . , tN at order close from the active layer and the refractive indices and the thickness of the plurality of layers of the second SCH layer are respectively n1, n2, n3, . . . , nN and t1, t2, t3, . . . , tN at order close from the active layer, the relationship of the magnitudes of the refractive indices of the respective layers is set to be the relationship:

$$ns>n1>n2>n3>, \ldots, >nN>na>nb$$

such that the refractive indices become smaller the further away from the active layer including the relationship that the refractive index ns of the active layer is the highest, and the refractive index na of the n-type cladding layer is higher than the refractive index nb of the p-type cladding layer, the refractive index differences between the layers which are adjacent to one another in the plurality of layers respectively structuring the first SCH layer and the second SCH layer are set to be the relationship:

$$ns-n1=n1-n2=n2-n3=, \ldots, =nN-nb$$

(where nN−nb>nN−na), such that the refractive index differences are equal to one another, and the relationship of the thickness of the respective layers is set to be $$t1<t2<t3<, \ldots, <tN$$

such that the thickness becomes larger the further away from the active layer.

In order to achieve the above object, according to an eighth aspect of the present invention, there is provided a semiconductor light emitting device according to the fifth aspect, wherein, given that a refractive index of a layer having the lowest refractive index of the plurality of layers structuring the active layer is ns, the refractive indices and the thickness of the plurality of layers of the first SCH layer are respectively n1, n2, n3, . . . , nN and t1, t2, t3, . . . , tN at order close from the active layer and the refractive indices and the thickness of the plurality of layers of the second SCH layer are respectively n1, n2, n3, . . . , nN and t1, t2, t3, . . . , tN at order close from the active layer, the relationship of the magnitudes of the refractive indices of the respective layers is set to be the relationship:

$$ns>n1>n2>n3>, \ldots, >nN>na>nb$$

such that the refractive indices become smaller the further away from the active layer including the relationship that the refractive index ns of the active layer is the highest, and the refractive index na of the n-type cladding layer is higher than the refractive index nb of the p-type cladding layer, the refractive index differences between the layers which are adjacent to one another in the plurality of layers respectively structuring the first SCH layer and the second SCH layer are set to be the relationship:

$$ns-n1>n1-n2>n2-n3>, \ldots, >nN-nb>nN-na$$

such that refractive index differences become smaller the further away from the active layer, and the relationship of the thickness of the respective layers is set to be:

$$t1<t2<t3<, \ldots, <tN$$

such that the thickness becomes larger the further away from the active layer.

In order to achieve the above object, according to a ninth aspect of the present invention, there is provided a semiconductor light emitting device according to the fifth aspect, wherein, given that a refractive index of a layer having the lowest refractive index of the plurality of layers structuring the active layer is ns, and refractive indices and thickness of the plurality of layers of the first SCH layer are respectively n1, n2, n3, . . . , nN and t1, t2, t3, . . . , tN at order close from the active layer and refractive indices and thickness of the plurality of layers of the second SCH layer are respectively n1, n2, n3, . . . , nN and t1, t2, t3, . . . , tN at order close from the active layer, the relationship of the thickness of the respective layers is set to be $$t1=t2=t3=, \ldots, =tN$$

the relationship of the magnitudes of the refractive indices of the respective layers is set to be the relationship:

$$ns>n1>n2>n3>, \ldots, nN>nb, \text{ and } na>nN$$

such that the refractive indices become smaller the further away from the active layer including the relationship that the refractive index ns of the active layer is the highest, and the refractive index na of the n-type cladding layer is higher than the refractive index nb of the p-type cladding layer, and the refractive index differences between the layers which are adjacent to one another in the plurality of layers respectively structuring the first SCH layer and the second SCH layer are set to be the relationship:

$$ns-n1>n1-n2>n2-n3>, \ldots, >n(N-1)-nN$$

such that the refractive index differences become smaller the further toward the n-type cladding layer and the p-type cladding layer from the active layer.

In order to achieve the above object, according to a tenth aspect of the present invention, there is provided a semiconductor light emitting device according to the fifth aspect, wherein, given that a refractive index of a layer having the lowest refractive index of the plurality of layers structuring the active layer is ns, the refractive indices and the thickness of the plurality of layers of the first SCH layer are respectively n1, n2, n3, . . . , nN and t1, t2, t3, . . . , tN at order close from the active layer and the refractive indices and the thickness of the plurality of layers of the second SCH layer are respectively n1, n2, n3, . . . , nN and t1, t2, t3, . . . , tN at order close from the active layer, the relationship of the magnitudes of the refractive indices of the respective layers is set to be the relationship:

$$ns>n1>n2>n3>, \ldots, >nN>nb, \text{ and } na>nN$$

such that the refractive indices become smaller the further away from the active layer including the relationship that the refractive index ns of the active layer is the highest, and the refractive index na of the n-type cladding layer is higher than the refractive index nb of the p-type cladding layer, the refractive index differences between the layers which are adjacent to one another in the plurality of layers respectively structuring the first SCH layer and the second SCH layer are set to be the relationship:

$$ns-n1=n1-n2=n2-n3=, \ldots, =nN-nb$$

such that the refractive index differences are equal to one another, and the relationship of the thickness of the respective layers is set to be $$t1<t2<t3<, \ldots, <tN$$

such that the thickness becomes larger the further away from the active layer.

In order to achieve the above object, according to an eleventh aspect of the present invention, there is provided a semiconductor light emitting device according to the fifth aspect, wherein, given that a refractive index of a layer having the lowest refractive index of the plurality of layers structuring the active layer is ns, the refractive indices and the thickness of the plurality of layers of the first SCH layer are respectively n1, n2, n3, . . . , nN and t1, t2, t3, . . . , tN at order close from the active layer and the refractive indices and the thickness of the plurality of layers of the second SCH layer are respectively n1, n2, n3, . . . , nN and t1, t2, t3, . . . , tN at order close from the active layer, the relationship of the magnitudes of the refractive indices of the respective layers is set to be the relationship:

$$ns>n1>n2>n3>, \ldots, >nN>nb, \text{ and } na>nN$$

such that the refractive indices become smaller the further away from the active layer including the relationship that the refractive index ns of the active layer is the highest, and the refractive index na of the n-type cladding layer is higher than the refractive index nb of the p-type cladding layer, the refractive index differences between the layers which are adjacent to one another in the plurality of layers respectively structuring the first SCH layer and the second SCH layer are set to be the relationship:

$$ns-n1>n1-n2>n2-n3>, \ldots, >n(N-1)-nN$$

such that refractive index differences become smaller the further away from the active layer, and the relationship of the thickness of the respective layers is set to be:

$$t1<t2<t3<, \ldots, <tN$$

such that the thickness becomes larger the further away from the active layer.

In order to achieve the above object, according to a twelfth aspect of the present invention, there is provided a semiconductor light emitting device according to the second aspect, wherein the semiconductor light emitting device is formed so as to be a buried structure.

In order to achieve the above object, according to a thirteenth aspect of the present invention, there is provided a semiconductor light emitting device according to the twelfth aspect, wherein the n-type cladding layer, the first SCH layer, the active layer, the second SCH layer, and a part of the p-type cladding layer are formed to be a mesa type, and the semiconductor light emitting device further comprises:

a first buried layer (16) formed from p-type InP such that one surface thereof contacts the semiconductor substrate or the n-type cladding layer at the both sides of the respective layers formed to be a mesa type; and a second buried layer (17) formed from n-type InP such that one surface thereof contacts the p-type cladding layer and the other surface thereof contacts the other surface of the first buried layer (16) at the both sides of the respective layers formed to be a mesa type.

In order to achieve the above object, according to a fourteenth aspect of the present invention, there is provided a semiconductor light emitting device according to the first aspect, wherein the semiconductor light emitting device is formed so as to be a ridge structure.

In order to achieve the above object, according to a fifteenth aspect of the present invention, there is provided a semiconductor light emitting device according to the fourteenth aspect, wherein, when the semiconductor substrate is n-type, the p-type cladding layer is formed as a ridge structured portion in which the substantially central portion at the outer side thereof is heaped to the upper side, and the semiconductor light emitting device further comprises:

a contact layer (19) formed at the upper side of the ridge structured portion at the p-type cladding layer;

an insulating layer (24) formed so as to open the central portion of the contact layer, and so as to cover the p-type cladding layer including the ridge structured portion; and an electrode (20) formed at the top portion of the insulating layer in a state in which one portion thereof is connected to the contact layer.

In order to achieve the above object, according to a sixteenth aspect of the present invention, there is provided a semiconductor light emitting device according to the first aspect, wherein a bandgap wavelength of InGaAsP structuring the n-type cladding layer is less than or equal to 0.97 $\mu$m.

In order to achieve the above object, according to a seventeenth aspect of the present invention, there is provided a semiconductor light emitting device according to the first aspect, wherein a width of the active layer formed from InGaAsP is greater than or equal to 3.5 $\mu$m.

In order to achieve the above object, according to an eighteenth aspect of the present invention, there is provided a semiconductor light emitting device according to the first aspect, wherein the high-power light output is greater than or equal to 700 mW.

In order to achieve the above object, according to a nineteenth aspect of the present invention, there is provided a semiconductor light emitting device according to the first aspect, wherein, when the semiconductor substrate is n-type, the n-type cladding layer is formed at the lower side of the active layer, and the p-type cladding layer is formed at the upper side of the active layer.

In order to achieve the above object, according to a twentieth aspect of the present invention, there is provided a semiconductor light emitting device according to the first aspect, wherein, when the semiconductor substrate is p-type, the n-type cladding layer is formed at the upper side of the active layer, and the p-type cladding layer is formed at the lower side of the active layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention, and together with the general description given above and the detailed description of the preferred embodiments given below, serve to explain the principles of the present invention.

DETAILED DESCRIPTION OF THE INVENTION

Figure 1:
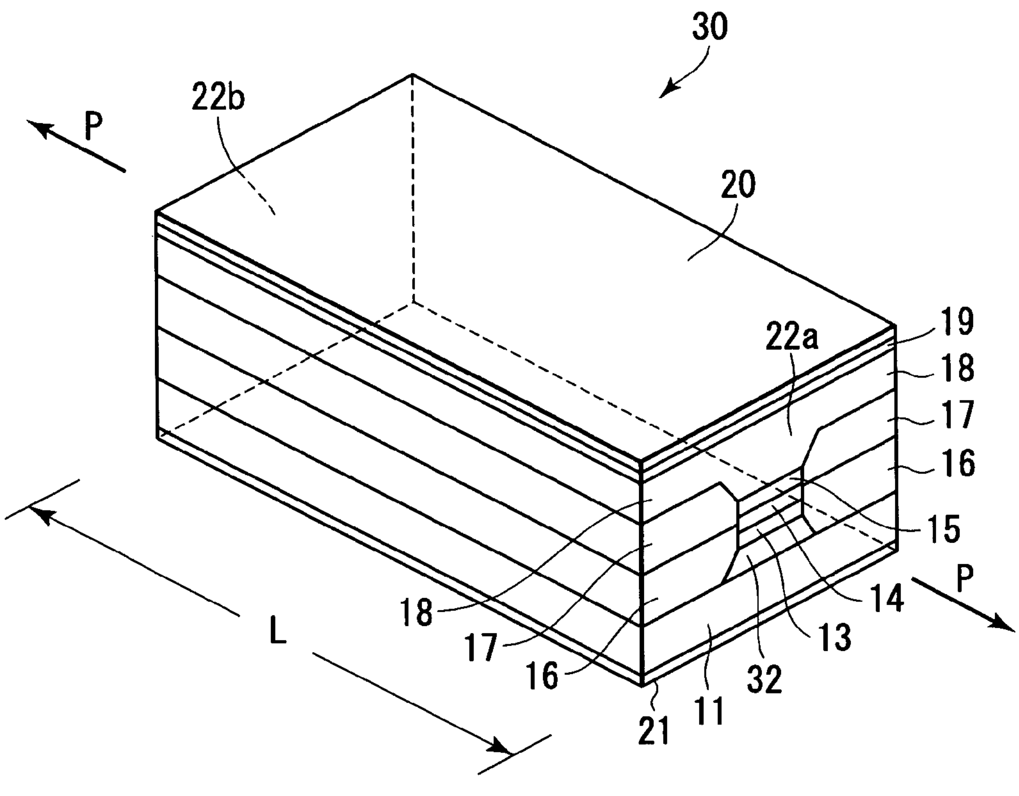
FIG. 1 is a perspective view for explanation of an entire structure of a semiconductor laser 30 applied as a first embodiment of a semiconductor light emitting device according to the present invention.

Reference will now be made in detail to the presently preferred embodiments of the invention as illustrated in the accompanying drawings, in which like reference numerals designate like or corresponding parts.

Hereinafter, embodiments of a semiconductor light emitting device according to the present invention will be described with reference to the drawings.

(First Embodiment)

FIG. 1 is a perspective view for explanation of an entire structure of a semiconductor laser 30 applied as a first embodiment of a semiconductor light emitting device according to the present invention.

Figure 2:
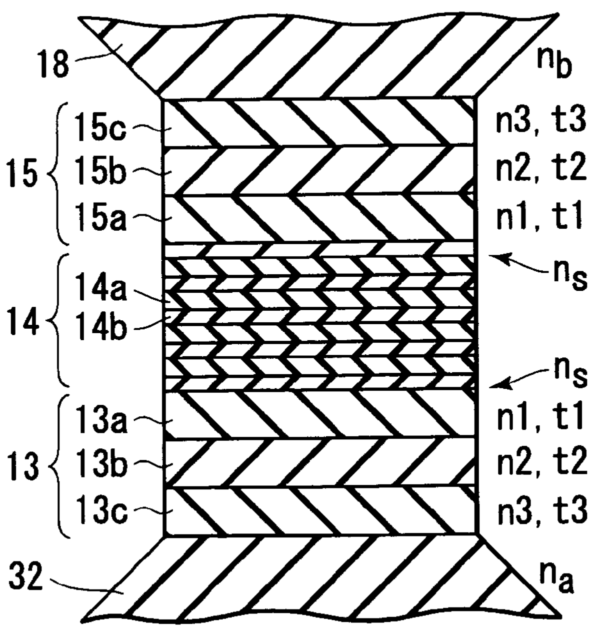
FIG. 2 is a cross sectional view for explanation of a structure of a main portion of the semiconductor laser 30 of FIG. 1.

FIG. 2 is a cross sectional view for explanation of a structure of a main portion of the semiconductor laser 30 of FIG. 1.

Note that, in this structure of the semiconductor laser 30, portions which are the same as those of the conventional semiconductor laser 10 described above are denoted by the same reference numerals, and will be described.

In the semiconductor laser 30 according to the first embodiment, on a semiconductor substrate 11 formed from n-type InP, an n-type cladding layer 32 formed from n-type InGaAsP, a first SCH layer 13 formed from InGaAsP, an active layer 14 formed from InGaAsP, and a second SCH layer 15 formed from InGaAsP are successively formed by a grown method which will be described later, or the like.

Note that, the n-type cladding layer 32, the first SCH layer 13, the active layer 14, and the second SCH layer 15 are formed to be a mesa type.

A first buried layer 16 formed from p-type InP and a second buried layer 17 formed from n-type InP are formed at the both sides of the respective layers formed to be a mesa type.

In this case, the first buried layer 16 is formed as a lower buried layer in a state in which one surface thereof contacts the semiconductor substrate 11 at the both sides of the aforementioned respective layers formed to be a mesa type.

Further, the second buried layer 17 is formed as an upper buried layer in a state in which one surface thereof contacts a p-type cladding layer 18 which will be described later and the other side thereof contacts the other side of the buried layer 16 at the both sides of the respective layers formed to be a mesa type.

Furthermore, the p-type cladding layer 18 formed from p-type InP is formed at the upper side of the second SCH layer 15 and the top surface of the second buried layer 17.

A p electrode 20 is provided at the top surface of a p-type contact layer 19 formed at the top surface of the p-type cladding layer 18.

An n electrode 21 is provided at the bottom surface of the n-type semiconductor substrate 11.

In addition, as the active layer 14, as shown in FIG. 1, a bulk structure structured from one uniform material may be used.

However, here, in order to realize a good oscillation characteristic as the semiconductor laser 30, as shown in FIG. 2, a four-layer MQW (Multi-quantum well) structure, in which four well layers 14*a* and five barrier layers 14*b* positioned at the both sides of the respective well layers 14*a* are alternately formed, is used as the active layer 14.

A multilayer structure formed from a plurality of layers (three layers in the illustration) 13*a*, 13*b*, and 13*c*, . . . , 13N is used as the first SCH layer 13 positioned at the lower side of the active layer 14 having the four-layer MQW structure.

Also, a multilayer structure formed from a plurality of layers (three layers in the illustration) 15*a*, 15*b*, 15*c*, . . . , 15N is used as the second SCH layer 15 positioned at the upper side of the active layer 14.

As shown in FIG. 2, a refractive index of the barrier layer 14*b* in the active layer 14 is ns, and a refractive index of the n-type cladding layer 32 is na, and a refractive index of the p-type cladding layer 18 is nb.

Further, the respective refractive indices and the respective thickness of the plurality of layers 13*a*, 13*b*, and 13*c* structuring the first SCH layer 13 are respectively n1, n2, n3, . . . , nN and t1, t2, t3, . . . , tN at order close from the active layer 15.

In the same way, the respective refractive indices and the respective thickness of the plurality of layers 15*a*, 15*b*, and 15*c* structuring the second SCH layer 15 are respectively n1, n2, n3, . . . , nN and t1, t2, t3, . . . , tN at order close from the active layer 14.

The relationship of the magnitudes of the refractive indices of the respective layers is set such that the refractive index of the active layer 14 is the highest, and the refractive indices decrease so as to become smaller the further away from the active layer 14. In addition, the refractive index na of the n-type cladding layer 32 formed from InGaAsP is set so as to be higher than the refractive index nb of the p-type cladding layer 18.

Namely, the relationship of the magnitudes of the refractive indices of the respective layers is set so as to be:

$$ns>n1>n2>n3>, \ldots, >nN>na>nb.$$

Figure 3:
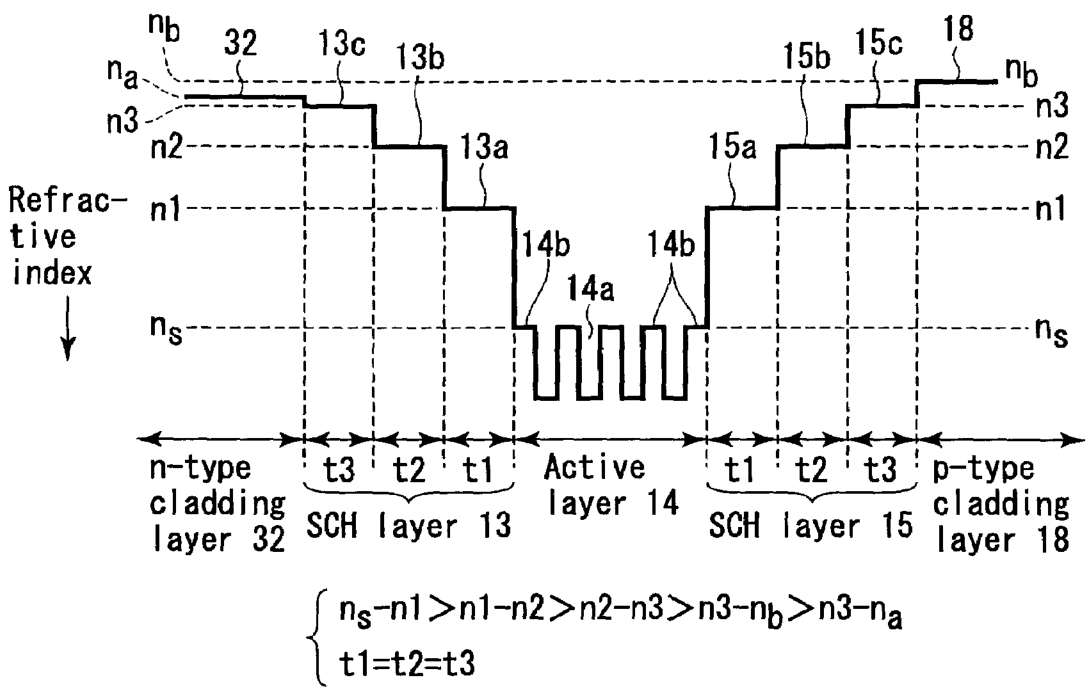
FIG. 3 is a diagram for explanation of the characteristics of the refractive indices of respective layers in the semiconductor laser 30 of FIG. 1.

Moreover, in the semiconductor laser 30, as shown in FIG. 3, the refractive index differences between the layers which are adjacent to one another in the plurality of layers structuring the first SCH layer 13 and the second SCH layer 15 are set so as to become smaller the further toward the both cladding layers 32 and 18 from the active layer 14.

Namely, the refractive index differences between the layers which are adjacent to one another are set so as to be:

$$ns-n1>n1-n2>n2-n3>, \ldots, >nN-nb>nN-na.$$

Further, the thickness t1, t2, and t3 of the respective layers 13*a*, 13*b*, and 13*c*, and 15*a*, 15*b*, and 15*c* structuring the first SCH layer 13 and the second SCH layer 15 are set so as to be equal to one another.

Namely, the thickness of the respective layers is set so as to be:

$$t1=t2=t3=, \ldots, =tN.$$

In the semiconductor laser 30 structured in this way, when a direct voltage is applied between the p electrode 20 and the n electrode 21, light P is generated at the active layer 14, and the light P is emitted to the exterior from end surfaces 22*a* and 22*b* of the semiconductor laser 30.

In this case, as shown in the characteristic of refractive index of FIG. 3, the refractive index differences between the layers which are adjacent to one another in the plurality of layers structuring the first SCH layer 13 and the second SCH layer 15 are set so as to become smaller the further toward the both cladding layers 32 and 18 from the active layer 14.

In accordance therewith, at a region where the refractive indices are high in regions in the vicinity of the active layer 14 in the first SCH layer 13 and the second SCH layer 15, the refractive indices between the respective layers drastically decrease. At the regions where the refractive indices are low in regions in the vicinity of the both cladding layers 32 and 18, the refractive indices between the respective layers gently decrease.

Therefore, in the semiconductor laser 30, the degree of concentration of light in the optical waveguide is attenuated. Namely, the optical confinement coefficient can be lowered, and the internal loss is reduced.

Figure 4:
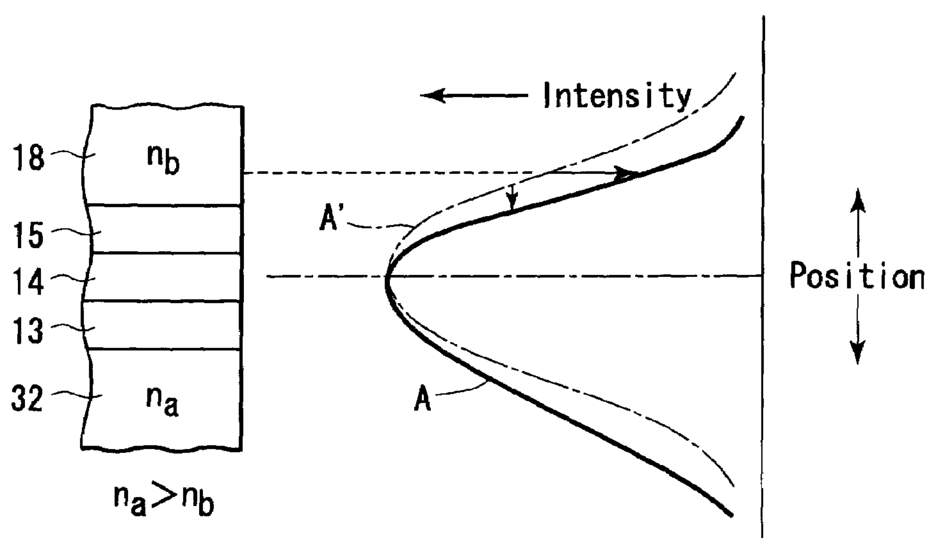
FIG. 4 is a diagram for explanation of the characteristics of the distribution of light in the semiconductor laser 30 of FIG. 1.

Further, in the semiconductor laser 30 structured in this way, because the refractive index na of the n-type cladding layer 32 formed from InGaAsP is higher than the refractive index nb of the p-type cladding layer 18 formed from InP, as shown in FIG. 4, the distribution of light is distributed so as to deflect to the n-type cladding layer 32 side as the characteristic curve A as compared with the characteristic curve A' which is vertically symmetrical taking the active layer 14 as the center when the both cladding layers are made to have the same refractive indices.

Therefore, in the semiconductor laser 30 structured in this way, an increase of optical loss by intervalence band light absorption at the p-type cladding layer 18 due to the optical confinement coefficient at the active layer 14, the first SCH layer 13, and the second SCH layer 15 being lowered, can be suppressed, and high-power laser beam can be outputted due to the suppression.

In the semiconductor laser 30 structured in this way, because a refractive index difference of the active layer 14 and the n-type cladding layer 32 is smaller than that in the conventional semiconductor laser, a maximum width of the active layer which can suppress a lateral high-order mode can be enlarged. In accordance therewith, there is further advantage for making laser light have high-power.

Moreover, in the semiconductor laser 30 structured in this way, the structure thereof is simpler than that of the conventional semiconductor laser at which an optical field control layer whose refractive index is high is provided in the n-type cladding layer as described above, and the width of the active layer 14 can be enlarged. In accordance therewith, deterioration of can be prevented due to an increase of the value of resistance of element.

In addition, in the semiconductor laser 30 structured in this way, because there is no need to increase the thickness of the p-type cladding layer 18, there is no concern that the deterioration of light output due to the increase of the value of resistance of element is brought about as the conventional semiconductor laser.

(Second Embodiment)

Figure 5:
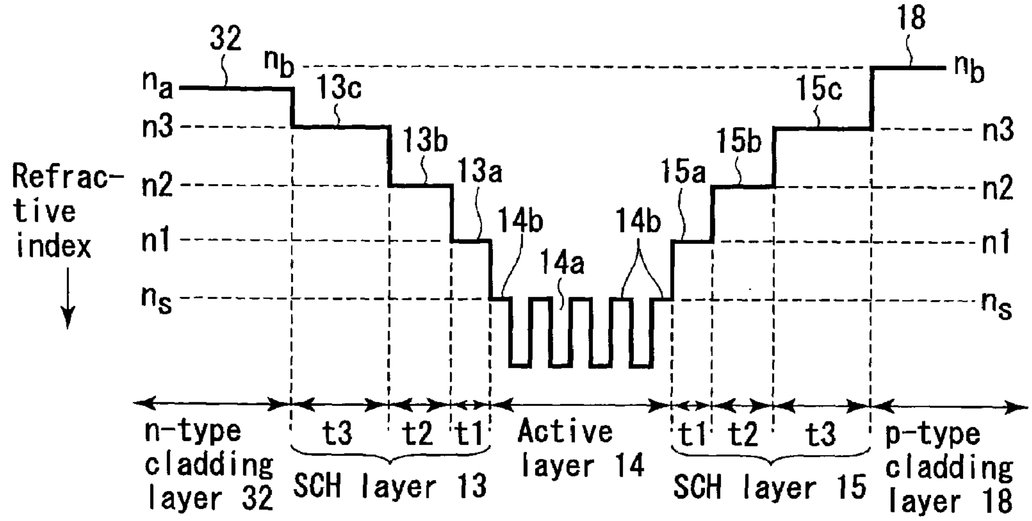
FIG. 5 is a diagram for explanation of the characteristics of the refractive indices of the respective layers in the semiconductor laser 30 applied as a second embodiment of the semiconductor light emitting device according to the present invention.

FIG. 5 is a diagram for explanation of the characteristics of the refractive indices of the respective layers in a semiconductor light emitting device according to a second embodiment of the present invention.

Note that a structure of the semiconductor light emitting device according to the second embodiment is the same way as that of the first embodiment shown in FIG. 1.

In the first embodiment described above, as a method for reducing the optical confinement coefficient at the active layer 14, the first SCH layer 13, and the second SCH layer 15, the refractive index differences between the layers which are adjacent to one another in the plurality of layers structuring the first SCH layer 13 and the second SCH layer 15 are set so as to become smaller the further away from the active layer 14, the thickness relationship of the respective layers are set so as to be equal to one another.

In the second embodiment, as shown in FIG. 5, the relationship of the magnitudes of the refractive indices of the respective layers is set to be the relationship:

$$ns>n1>n2>n3>, \ldots, nN>na>nb$$

such that the refractive indices become smaller the further away from the active layer 14 including the relationship that the refractive index ns of the active layer 14 is the highest, and the refractive index na of the n-type cladding layer 32 is higher than the refractive index nb of the p-type cladding layer 18.

In addition thereto, in the second embodiment, as a method for reducing the optical confinement coefficient at the active layer 14, the first SCH layer 13, and the second SCH layer 15, the refractive index differences between the layers which are adjacent to one another in the plurality of layers structuring the first SCH layer 13 and the second SCH layer 15 are set so as to be equal to one another, and the thickness t1, t2, and t3 of the respective layers 13*a*, 13*b*, and 13*c*, and 15*a*, 15*b*, and 15*c* are set so as to become larger the further away from the active layer 14.

Namely, the refractive index differences between the layers which are adjacent to one another are set so as to be:

$$ns-n1=n1-n2=n2-n3=, \ldots, =nN-nb$$

(where, nN−nb>nN−na).

Further, the relationship of the thickness of the respective layers is set so as to be:

$$t1<t2<t3<, \ldots, <tN.$$

In the second embodiment, because the characteristics of the refractive indices are set as described above, at a region where the refractive indices are high in regions in the vicinity of the active layer 14 in the first SCH layer 13 and the second SCH layer 15, the refractive indices between the respective layers drastically decrease. At a region where the refractive indices are low in regions in the vicinity of the both cladding layers 32 and 18, the refractive indices between the respective layers gently decrease.

Therefore, in the semiconductor laser 30, the degree of concentration of light is attenuated in the optical waveguide. Namely, the optical confinement coefficient can be lowered, and the internal loss is reduced.

In this case as well, because the refractive index na of the n-type cladding layer 32 formed from InGaAsP is higher than the refractive index nb of the p-type cladding layer 18 formed from InP, as shown in FIG. 4 described above, the distribution of light is distributed so as to deflect to the n-type cladding layer 32 side.

Therefore, in the semiconductor laser 30 structured in this way, an increase of optical loss by intervalence band light absorption at the p-type cladding layer 18 due to the optical confinement coefficient at the active layer 14, the first SCH layer 13, and the second SCH layer 15 being lowered, can be suppressed, and high-power laser output beam can be obtained.

(Third Embodiment)

Figure 6:
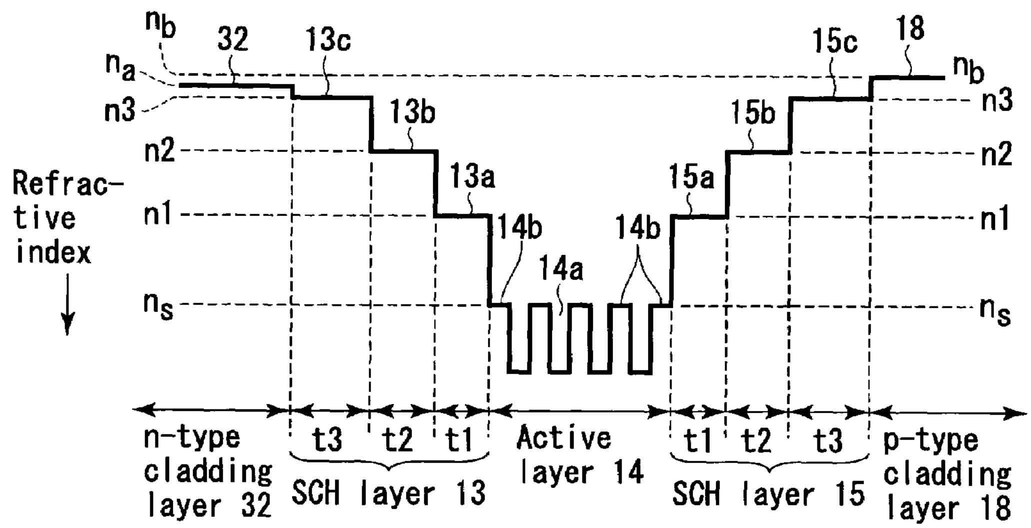
FIG. 6 is a diagram for explanation of the characteristics of the refractive indices of the respective layers in the semiconductor laser 30 applied as a third embodiment of the semiconductor light emitting device according to the present invention.

FIG. 6 is a diagram for explanation of characteristics of the refractive indices of respective layers of a semiconductor light emitting device according to a third embodiment of the present invention.

Note that, a structure of the semiconductor light emitting device according to the third embodiment is the same as that of the first embodiment.

In the first embodiment described above, as a method for reducing the optical confinement coefficient at the active layer 14, the first SCH layer 13, and the second SCH layer 15, the refractive index differences between the layers which are adjacent to one another in the plurality of layers structuring the first SCH layer 13 and the second SCH layer 15 are set so as to become smaller the further away from the active layer 14, the relationship of the thickness of the respective layers is set so as to be equal to one another.

In the third embodiment, as shown in FIG. 6, the relationship of the magnitudes of the refractive indices of the respective layers is set to be the relationship:

$$ns>n1>n2>n3>, \ldots, >nN>na>nb$$

such that the refractive indices become smaller the further away from the active layer 14 including the relationship that the refractive index ns of the active layer 14 is the highest, and the refractive index na of the n-type cladding layer 32 is higher than the refractive index nb of the p-type cladding layer 18.

In addition thereto, in the third embodiment, as a method for reducing the optical confinement coefficient at the active layer 14, the first SCH layer 13, and the second SCH layer 15, the refractive index differences between the layers which are adjacent to one another in the plurality of layers structuring the first SCH layer 13 and the second SCH layer 15 are set so as to become smaller the further away from the active layer 14, and the thickness t1, t2, and t3 of the respective layers 13*a*, 13*b*, and 13*c*, and 15*a*, 15*b*, and 15*c* are set so as to become larger the further away from the active layer 14.

Namely, the refractive index differences between the layers which are adjacent to one another are set so as to be:

$$ns-n1>n1-n2>n2-n3>, \ldots, >nN-nb>nN-na.$$

Further, the relationship of the thickness of the respective layers is set so as to be:

$$t1<t2<t3<, \ldots, <tN.$$

In the third embodiment, because the characteristics of the refractive indices are set as described above, at a region where the refractive indices are high in regions in the vicinity of the active layer 14 in the first SCH layer 13 and the second SCH layer 15, the refractive indices between the respective layers drastically decrease. At a region where the refractive indices are low in regions in the vicinity of the both cladding layers 32 and 18, the refractive indices between the respective layers gently decrease.

Therefore, in the semiconductor laser 30, the degree of concentration of light is attenuated in the optical waveguide. Namely, the optical confinement coefficient can be lowered, and the internal loss is reduced.

In this case as well, because the refractive index na of the n-type cladding layer 32 formed from InGaAsP is higher than the refractive index nb of the p-type cladding layer 18 formed from InP, as shown in FIG. 4 described above, the distribution of light is deflected to the n-type cladding layer 32 side.

Therefore, in the semiconductor laser 30 structured in this way, an increase of optical loss by intervalence band light absorption at the p-type cladding layer 18 due to the optical confinement coefficient at the active layer 14, the first SCH layer 13, and the second SCH layer 15 being lowered, can be suppressed, and the high-power laser output beam can be obtained.

CONCRETE NUMERICAL EXAMPLES AND CHARACTERISTICS THEREOF

Next, the concrete numerical examples of the lengths, the widths, the thickness, the refractive indices of the respective portions of the semiconductor laser 30 according to the third embodiment as described above, which has the characteristics of the refractive indices as shown in FIG. 6 and the characteristics thereof will be described.

First, a resonator length L in the semiconductor laser 30 is set to be L=2.3 mm in the structure shown in FIG. 1.

One of the end surfaces 22*a* and 22*b* at the semiconductor laser 30 is an HR (high reflective) film, and the other is an LR (low reflective) film.

The width of the active layer 14 at the semiconductor laser 30 is set to 4.0 μm.

Further, the refractive indices ns, n1, n2, n3, and na of the respective layers 14, 13*a*, 13*b*, 13*c*, 15*a*, 15*b*, 15*c*, 32 and 18 as described above at the semiconductor laser 30 are expressed by bandgap wavelength, and set as follows.

ns=1.2 μm n1=1.15 μm n2=1.08 μm n3=0.99 μm na=0.95 μm nb=0.93 μm

Note that, because the p-type cladding layer 18 is structured from InP whose bandgap is determined, the bandgap wavelength nb is unconditionally 0.93 μm.

Furthermore, the thickness t1, t2, and t3 of the respective layers as described above at the semiconductor laser 30 are set as follows.

t1=3.0 nm t2=8.0 nm t3=25 nm

Although the thickness of the n-type cladding layer 32 is set to about 7.5 μm, it is usually difficult to match the lattice intervals of InGaAsP, which is four elements, and to form the InGaAsP to such a size.

In particular, when the bandgap wavelength na of the n-type cladding layer 32 is 0.95 μm, because the ratio of Ga and As is a slight quantity with respect to In and P, the difficulty of forming to such a thickness increases even more.

Therefore, in the present invention, the n-type cladding layer 32 which is formed so as to have the thickness of about 7.5 μm and whose bandgap wavelength na is 0.95 μm by the introduction of a dilution material, or by the fluid flow of respective gases and the control of growth rate, can be achieved.

EXAMPLE OF MANUFACTURING PROCESS

Next, an example of the process of manufacturing the semiconductor laser 30 in which the lengths, the widths, and the refractive indices of the respective portions are set as described above will be described.

First, on the semiconductor substrate 11 of n-type InP whose impurity concentration is 1 to $2\times10^{18}/cm^3$, the n-type cladding layer 32 formed from InGaAsP whose layer thickness is 7.5 μm and whose impurity concentration is 1 to $2\times10^{18}/cm^3$, and whose bandgap wavelength is 0.95 μm is formed by using the organometallic vapor phase epitaxy (MOVPE) method.

Next, on the n-type cladding layer 32, the first SCH layer 13 is formed as a multilayer structure, due to non-doped InGaAsP whose bandgap wavelengths are respectively 0.99 μm, 1.08 μm, and 1.15 μm being successively made to grow such that the thickness thereof are respectively 25 nm, 8 nm, and 3 nm, as the plurality of layers 13*a*, 13*b*, and 13*c* structuring the first SCH layer 13.

Due to the four layer well layers 14*a* formed from InGaAsP and the five layer barrier layers 14*b* formed from InGaAsP being alternately made to grow on the first SCH layer 13, the active layer 14 of the multi-quantum well structure in which the number of well layers is four is formed.

Next, due to non-doped InGaAsP whose bandgap wavelengths are respectively 1.15 μm, 1.08 μm, and 0.99 μm being successively made to grow on the active layer 14 such that the thickness thereof are respectively 3 nm, 8 nm, and 25 nm, as the plurality of layers 15*a*, 15*b*, and 15*c* structuring the second SCH layer 15, the second SCH layer 15 is formed as a multilayer structure.

Further, a lower layer portion of the p-type cladding layer 18 formed from InP whose impurity concentration is 5 to $7\times10^{17}/cm^3$, and whose thickness is 0.5 μm is made to grow on the second SCH layer 15.

Thereafter, a SiNx film is accumulated so as to be about several ten nm on the entire surface by the plasma CVD method or the like, and due to the layers being immersed in etching solution formed from mixed liquid of hydrochloric acid, hydrogen peroxide, and water, by using the SiNx film formed to be a stripe shape whose width is about 7 μm by the photolithography process as an etching mask, the n-type cladding layer 32, the first SCH layer 13, the active layer 14, and the second SCH layer 15 are formed to be a mesa type.

In accordance therewith, the width of the active layer 14 portion is about 4 μm.

Next, by using the SiNx film as a growth inhibition mask, after the first buried layer 16 and the second buried layer 17 are buried at both the sides of the respective layers formed to be a mesa type due to the p-type InP first buried layer (lower buried layer) 16 and the n-type InP second buried layer (upper buried layer) 17 being made to grow by the MOVPE method, the SiNx is eliminated.

Thereafter, an upper layer portion of the p-type cladding layer 18 formed from InP whose impurity concentration is 5 to $7\times10^{17}/cm^3$ is made to grow such that the thickness thereof is 2.5 μm, on the entire surface of the lower layer portion of the p-type cladding layer 18.

Moreover, the p-type contact layer 19 of InGaAs whose impurity concentration is about $5\times10^{18}/cm^3$ is made to grow such that the thickness thereof is 0.3 μm, on the p-type cladding layer 18.

The p electrode 20 is then formed on the top surface of the p-type contact layer 19.

Furthermore, the n-type electrode 21 is formed at the lower side of the semiconductor substrate 11.

Next, after a semiconductor chip formed shown in FIG. 1 is cut out such that the length thereof is L=2.3 mm, the semiconductor laser 30 is manufactured due to the LR film and the HR film being respectively applied at the front end surface 22*a* and the rear end surface 22*b*.

(Current-output Characteristic of the Semiconductor Laser 30)

Figure 7:
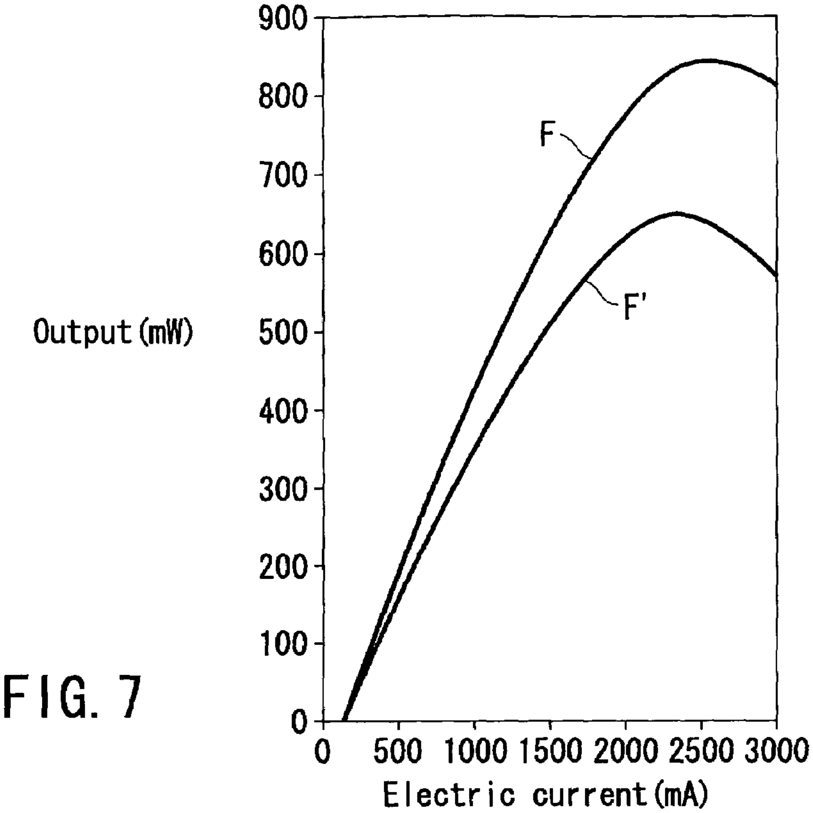
FIG. 7 is a diagram for explanation of supply current vs. light output characteristics in the semiconductor laser 30 applied as the third embodiment of the semiconductor light emitting device according to the present invention.

FIG. 7 shows the current-output characteristic of the semiconductor laser 30 manufactured as described above.

In FIG. 7, the characteristic curve F shows current vs. output characteristic of the semiconductor laser 30 according to the present invention manufactured in accordance with the above-described numerical examples, and the characteristic curve F' shows current vs. output characteristic of the conventional semiconductor laser which uses a conventional n-type cladding layer 12 whose refractive index is equal to that of the p-type cladding layer 18, in place of the n-type cladding layer 32, and in which the width of the active layer is 3.3 μm.

As is clear from FIG. 7, the light output by the characteristic curve F of the semiconductor laser 30 manufactured by the present invention is larger than the light output by the characteristic curve F' of the conventional semiconductor laser.

In the light output by the characteristic curve F of the semiconductor laser 30 manufactured by the present invention, in particular, the slope efficiency (inclination) at the low current region is markedly larger than that of the characteristic curve F' of the conventional semiconductor laser.

Further, the light output by the characteristic curve F of the semiconductor laser 30 manufactured by the present invention is a high power greatly exceeding 700 mW, as compared with the characteristic curve F' of the conventional semiconductor laser in which the light output is limited to 650 mW at the most.

These are exhibited as the marked effects of the semiconductor laser 30 of the present invention by using the n-type cladding layer 32 formed from InGaAaP whose refractive index is higher than that of the p-type cladding layer 18 formed from InP.

Namely, in the semiconductor laser 30 structured in this way, because the distribution of light can be deflected to the n-type cladding layer 32 side, the effect that the quantity of optical loss by intervalence band light absorption on the basis of the distribution of light in the p-type cladding layer 18 is suppressed, and an attempt can be made to make the light output as the semiconductor laser 30 have high-power by the quantity of suppression, can be obtained.

In the semiconductor laser 30 manufactured according to the present invention, due to the width of the active layer 14 being able to be enlarged so as to be greater than or equal to 4.0 μm, the heat radiating effect is made to be large, and the current value of the saturation power increases, and that much more high-power light output (a maximum of about 850 mW) can be obtained.

Further, the optical confinement coefficient in the p-type cladding layer 18 of the semiconductor laser 30 is 21%, and it has been confirmed that it is greatly reduced as compared with 42% which is the confinement coefficient of the conventional structure.

Moreover, with respect to the value of the internal loss estimated from semiconductor lasers actually manufactured, the value is 5 to 6 $cm^{-1}$ in the semiconductor laser of the conventional structure. In contrast, the value in the semiconductor laser 30 is improved so as to be up to 3.5 $cm^{-1}$.

(Fourth Embodiment)

Figure 8:
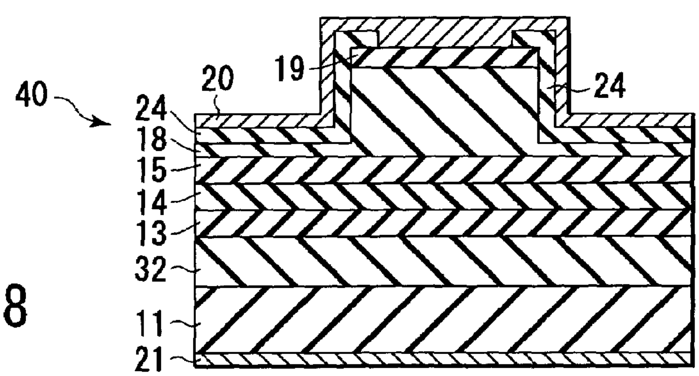
FIG. 8 is a cross sectional view for explanation of a structure in a case in which the present invention is applied to a semiconductor laser of a ridge structure as a fourth embodiment of the semiconductor light emitting device according to the present invention.

FIG. 8 is a diagram for explanation of a structure in a case in which the present invention is applied to a semiconductor laser 40 of a ridge structure as a semiconductor light emitting device according to a fourth embodiment of the present invention.

The semiconductor laser 30 according to the first to third embodiments described above is the buried structure. However, the present invention can be applied to the semiconductor laser 40 having the ridge structure shown in FIG. 8 as an example of the semiconductor light emitting device according to the fourth embodiment of the present invention.

Note that in the structure of the semiconductor laser 40 according to the fourth embodiment, portions which are the same as those of the semiconductor laser 30 according to the first to third embodiments described above are denoted by the same reference numerals, and will be described.

In the semiconductor laser 40 according to the fourth embodiment, on the semiconductor substrate 11 formed from n-type InP, the n-type cladding layer 32 formed from n-type InGaAsP, the first SCH layer 13 formed from InGaAsP, the active layer 14 formed from InGaAsP, and the second SCH layer 15 formed from InGaAsP are successively formed by a grown method as described above, or the like.

The p-type cladding layer 18 formed on the second SCH layer 15 is formed as a ridge structure portion in which the both side portions at the outer side are formed so as to be low, and the substantially central portion is heaped to the upper side.

The contact layer 19 is formed on the upper side of the aforementioned ridge structure portion at the p-type cladding layer 18 formed in this way.

An insulating layer 24 formed from $SiO_2$ is formed so as to open the central portion of the contact layer 19 and cover the p-type cladding layer 18 including the ridge structure portion.

Further, the n electrode 20 is formed at the upper portion of the insulating layer 24 in a state in which one portion thereof is connected to the contact layer 19.

Note that, in FIG. 8, reference numeral 21 is the n electrode 21 formed at the bottom surface of the semiconductor substrate 11.

In the case of the semiconductor laser 40 having such a ridge structure as well, because the n-type cladding layer 32 formed from InGaAsP whose refractive index is larger than that of the p-type cladding layer 18 formed from InP is used, in the same way as in the semiconductor laser 30 according to the first to third embodiments described above, because the distribution of light can be deflected to the n-type cladding layer 32 side, high-power laser output beam can be obtained.

(Fifth Embodiment)

Figure 9:
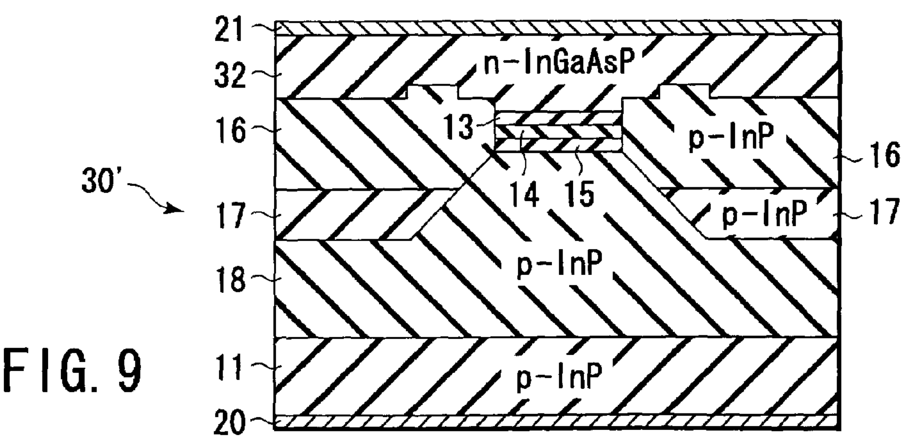
FIG. 9 is a cross sectional view for explanation of a structure of a semiconductor laser 30' formed on a p-type semiconductor substrate as a fifth embodiment of the semiconductor light emitting device according to the present invention.

FIG. 9 is a diagram for explanation of a semiconductor laser 30' structured on a p-type semiconductor substrate as a semiconductor light emitting device according to a fifth embodiment of the present invention.

The semiconductor laser 30 according to the first to third embodiments shows the example in which the respective layers are formed on the n-type semiconductor substrate 11. However, as shown in FIG. 9 as the fifth embodiment, the present invention can be applied to the semiconductor laser 30' in which respective layers are structured on a p-type semiconductor substrate 11' in the same way.

Note that, in the structure of the semiconductor laser 30' according to the fifth embodiment, portions which are the same as those of the semiconductor laser 30 according to the first to third embodiments described above are denoted by the same reference numerals, and will be described.

In the semiconductor laser 30' according to the fifth embodiment, as shown in FIG. 9, on the semiconductor substrate 11' formed from p-type InP, the p-type cladding layer 18 formed from p-type InP, the second SCH layer 15 formed from InGaAsP, the active layer 14 formed from InGaAsP, and the first SCH layer 13 formed from InGaAsP are successively formed by a grown method as described above, or the like.

Note that the p-type cladding layer 18, the second SCH layer 15, the active layer 14, and the first SCH layer 13 are formed to be a mesa type.

The second buried layer 17 formed from n-type InP and the first buried layer 16 formed from p-type InP are formed at the both sides of the respective layers formed to be a mesa type.

In this case, the second buried layer 17 is formed as a lower buried layer in a state in which one surface thereof contacts the p-type cladding layer 18 at the both sides of the aforementioned respective layers formed to be a mesa type.

The first buried layer 16 is formed as an upper buried layer in a state in which one surface thereof contacts the n-type cladding layer 32 which will be described later and the other side thereof contacts the other side of the second buried layer 17 at the both sides of the respective layers formed to be a mesa type.

Further, the n-type cladding layer 32 formed from n-type InGaAsP is formed at the upper side of the first SCH layer 13 and the top surface of the first buried layer 16.

The n electrode 21 is provided on the top surface of the n-type cladding layer 32.

The p electrode 20 is provided at the bottom surface of the p-type semiconductor substrate 11'.

In this way, in the semiconductor laser 30' in which the respective layers are formed on the p-type semiconductor substrate 11' as well, due to the n-type cladding layer 32 being structured from InGaAsP whose refractive index is higher than that of the p-type cladding layer 18 formed from InP, the same effect as in the semiconductor laser 30 according to the first to third embodiments can be obtained.

(Sixth Embodiment)

Figure 10:
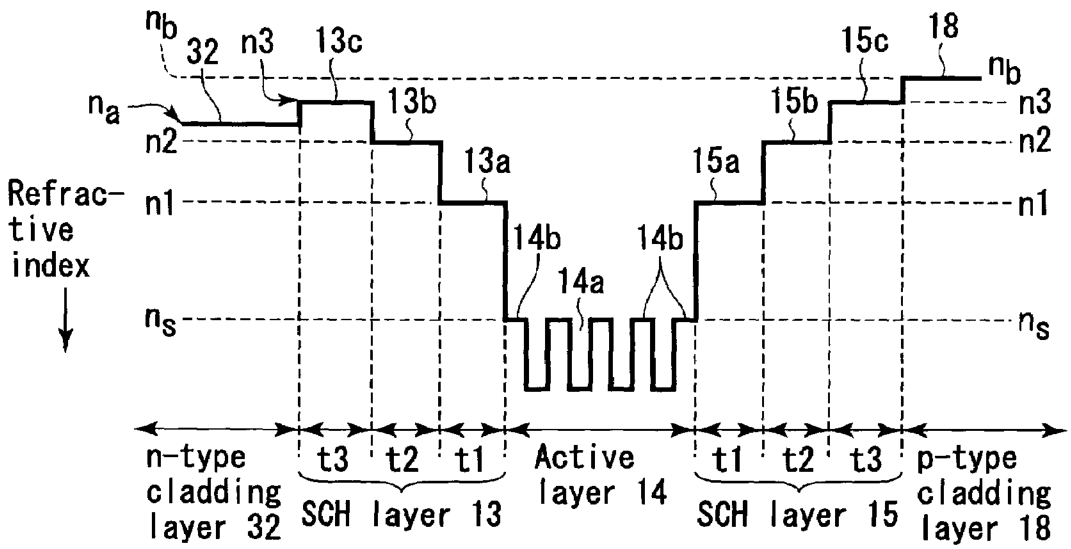
FIG. 10 is a diagram for explanation of the characteristics of the refractive indices of the respective layers in the semiconductor laser 30 applied as a sixth embodiment of the semiconductor light emitting device according to the present invention.

FIG. 10 is a diagram for explanation of characteristics of the refractive indices of respective layers of a semiconductor light emitting device according to a sixth embodiment of the present invention.

Note that, a structure of the semiconductor light emitting device according to the sixth embodiment is the same as in the first embodiment.

In the semiconductor laser 30 according to the first to third embodiments described above, the refractive index nN of the outermost layer 13N of the first SCH layer 13 is set so as to be higher than the refractive index na of the n-type cladding layer 32 formed from InGaAsP (na<nN).

However, in the semiconductor laser 30 according to the sixth embodiment, as shown in FIG. 10, the refractive index nN of the outermost layer 13N of the first SCH layer 13 is set so as to be lower than the refractive index na of the n-type cladding layer 32 formed from InGaAsP (na>nN).

In the semiconductor laser 30 in which the respective layers are structured in this way, due to the n-type cladding layer 32 being structured from InGaAsP whose refractive index is higher than that of the p-type cladding layer 18 formed from InP, the same effect as in the semiconductor laser 30 according to the first to third embodiments described above can be obtained.

Further, in the semiconductor laser 30 according to the sixth embodiment, the refractive index nN of the outermost layer 13N of the first SCH layer 13 being set so as to be lower than the refractive index na of the n-type cladding layer 32 formed from InGaAsP, the effect that carrier (hall) which is injected is prevented from overflowing can be obtained.

Note that, in the semiconductor laser 30 according to the sixth embodiment, as shown in FIG. 10, the relationship of the magnitudes of the refractive indices of the respective layers is set to be the relationship:

$$ns>n1>n2>n3>, \ldots, >nN>nb, \text{ and } na>nN$$

such that the refractive indices become smaller as the layers go away from the active layer including the relationship that a refractive index ns of a layer having the lowest refractive index of a plurality of layers structuring the active layer 14 is the highest, and the refractive index na of the n-type cladding layer 32 is higher than the refractive index nb of the p-type cladding layer 18.

In addition thereto, in the semiconductor laser 30 according to the sixth embodiment, other than the fact that the refractive index nN of the outermost layer 13N of the first SCH layer 13 is set so as to be lower than the refractive index na of the n-type cladding layer 32 formed from InGaAsP (na>nN), the refractive index differences between the layers which are adjacent to one another in the plurality of layers structuring the first SCH layer 13 and the second SCH layer 15 are set to be the relationship:

$$ns-n1>n1-n2>n2-n3>, \ldots, >n(N-1)-nN$$

such that the refractive index differences become smaller the further toward the both cladding layers 32 and 18 from the active layer 14.

Further, the thickness of the respective layers is set to be the relationship:

$$t1=t2=t3=, \ldots, =tN$$

such that the thickness are equal to one another.

Namely, this is applied such that some of the characteristics of refractive indices (ns−n1>n1−n2> n2−n3>, . . . , >nN−nb>nN−na) of the semiconductor laser 30 according to the first embodiment shown in FIG. 3 described above are modified.

However, the structure in which the refractive index nN of the outermost layer 13N of the first SCH layer 13 in the semiconductor laser 30 according to the sixth embodiment is set so as to be lower than the refractive index na of the n-type cladding layer 32 formed from InGaAsP, can be applied as the structure in which some of the characteristics of refractive indices of the semiconductor laser 30 according to the second embodiment shown in FIG. 5 described above, in which the refractive index differences between the layers which are adjacent to one another in the plurality of layers structuring the first SCH layer 13 and the second SCH layer 15 are set so as to be equal (ns−n1= n1−n2=n2−n3=, . . . , =nN−nb, where nN−nb>nN−na), and the thickness of the respective layers are set so as to become larger the further away from the active layer 14 (t1<t2<t3<, . . . , <tN), are modified (ns−n1= n1−n2=n2−n3=, . . . , =nN−nb.)

Moreover, the structure in which the refractive index nN of the outermost layer 13N of the first SCH layer 13 in the semiconductor laser 30 according to the sixth embodiment is set so as to be lower than the refractive index na of the n-type cladding layer 32 formed from InGaAsP can be applied as the structure in which some of the characteristic of the refractive indices of the semiconductor laser 30 according to the third embodiment shown in FIG. 6 described above, in which the refractive index differences between the layers which are adjacent to one another in the plurality of layers structuring the first SCH layer 13 and the second SCH layer 15 are set so as to become smaller the further away from the active layer 14 (ns−n1>n1−n2>n2−n3>, . . . , >nN−nb>nN−na), and the thickness of the respective layers are set so as to become larger (t1<t2<t3<, . . . , <tN) the further away from the active layer 14, are modified (ns−n1>n1−n2>n2−n3>, . . . , >n(N−1)−nN.)

(Seventh Embodiment)

Figure 11:
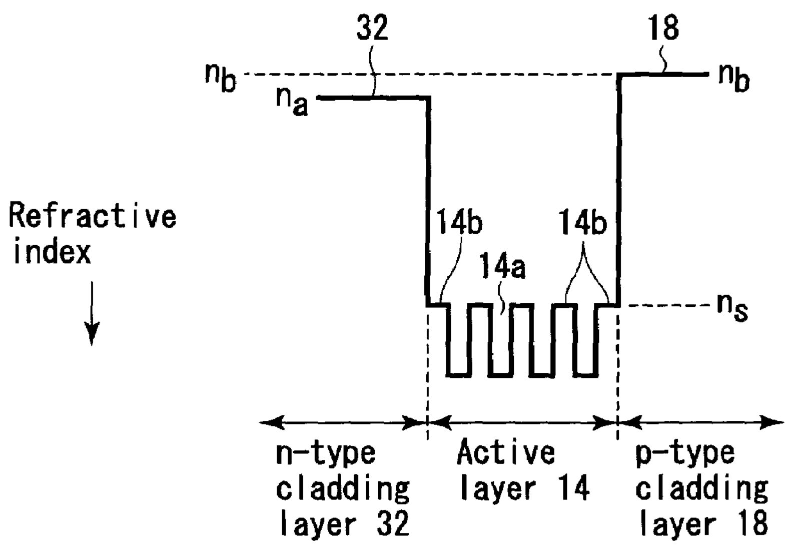
FIG. 11 is a diagram for explanation of the characteristics of the refractive indices of respective layers in a semiconductor laser 40 applied as a seventh embodiment of the semiconductor light emitting device according to the present invention.
Figure 12:
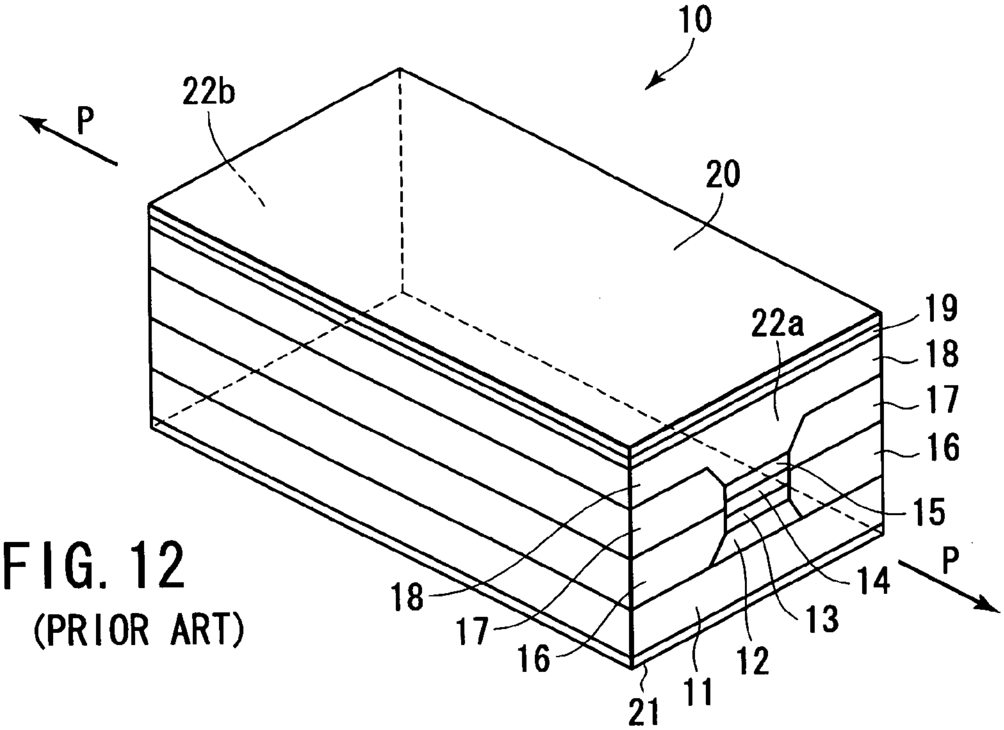
FIG. 12 is a perspective view for explanation of a structure of a conventional semiconductor laser.
Figure 13:
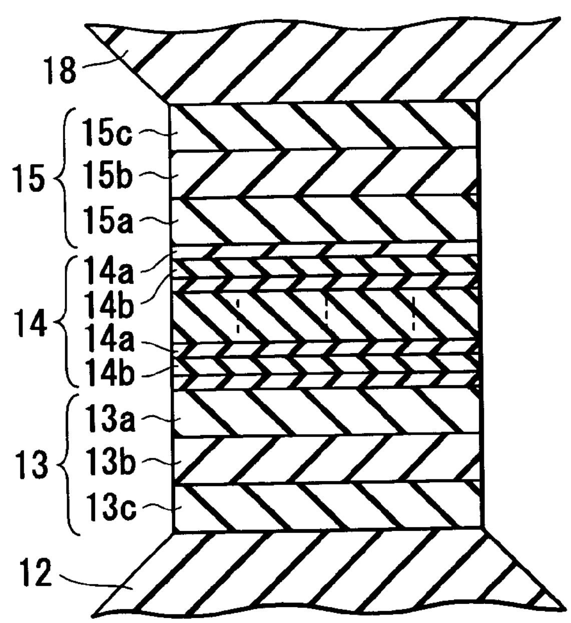
FIG. 13 is a cross sectional view for explanation of a structure of a main portion of the semiconductor laser of FIG. 12.
Figure 14:
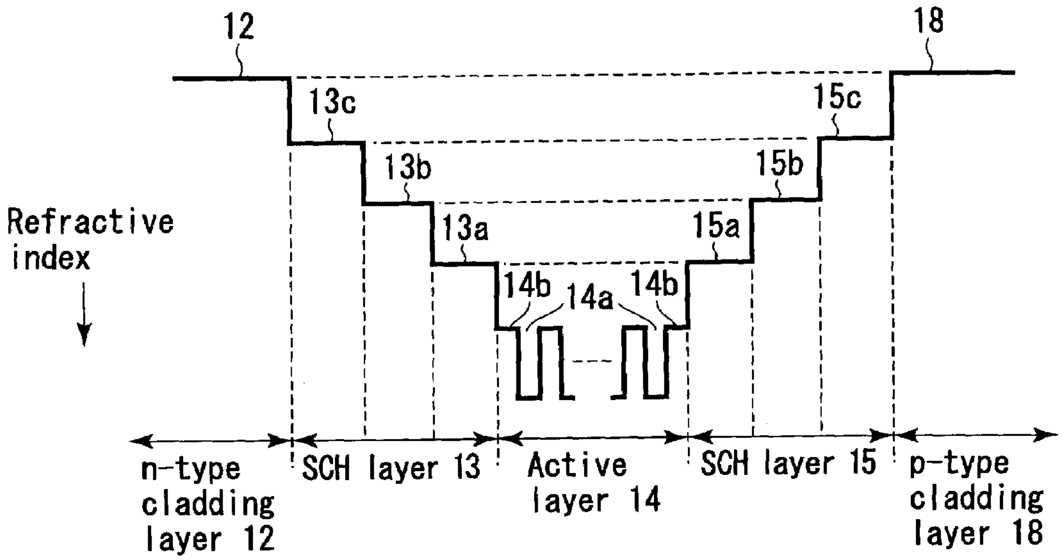
FIG. 14 is a diagram for explanation of the characteristics of the refractive indices of the respective layers in the semiconductor laser of FIG. 12.
Figure 15:
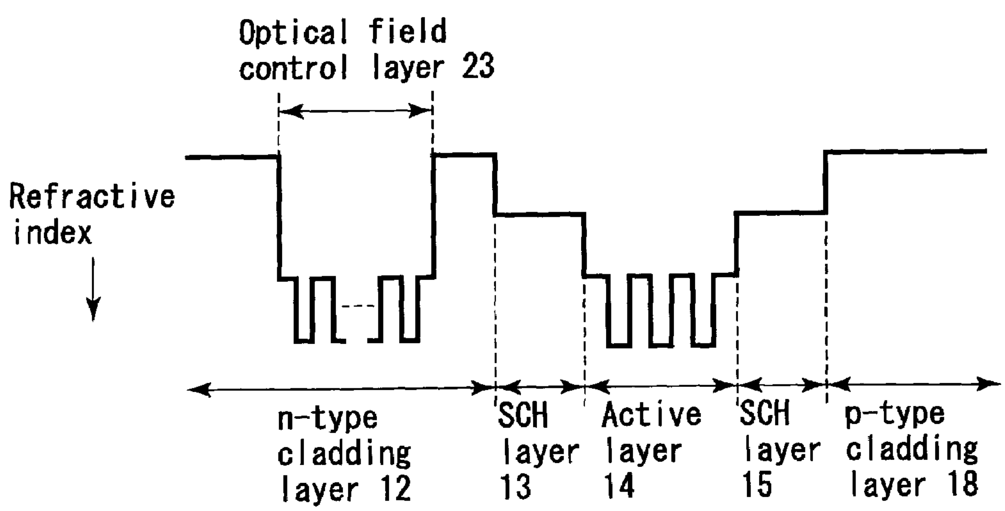
FIG. 15 is a diagram for explanation of the characteristics of the refractive indices of the respective layers in a case in which an optical field layer is provided in an n-type cladding layer as another conventional semiconductor laser.

FIG. 11 is a diagram for explanation of characteristics of the refractive indices of respective layers of a semiconductor light emitting device according to a seventh embodiment of the present invention.

Note that, a structure of the semiconductor light emitting device according to the seventh embodiment is the same as in the first embodiment shown in FIG. 1.

In the semiconductor laser 30 according to the first to third and sixth embodiments described above, the first SCH layer 13 and the second SCH layer 15 are provided at the both sides of the active layer 14.

However, in the semiconductor laser 30 according to the seventh embodiment, as shown in FIG. 11, the first SCH layer 13 and the second SCH layer 15 are not provided at the both sides of the active layer 14, and the p-type cladding layer 18 and the n-type cladding layer 32 are formed so as to be adjacent to one another at the both sides of the active layer 14.

In the semiconductor laser 30 in which the respective layers are structured in this way, due to the n-type cladding layer 32 being structured from InGaAsP whose refractive index is higher than that of the p-type cladding layer 18 formed from InP, the distribution of light can be deflected to the n-type cladding layer 32 side.

Therefore, the quantity of optical loss by intervalence band light absorption on the basis of the distribution of light in the p-type cladding layer 18 is suppressed, and an attempt can be made to make the light output as the semiconductor laser 30 have a higher power by the quantity of suppression.

Accordingly, in the semiconductor laser 30 according to the seventh embodiment, except that the first SCH layer 13 and the second SCH layer 15 are not provided at the both sides of the active layer 14, the same effect as in the semiconductor laser 30 according to the first to third embodiments described above can be obtained.

OTHER MODIFIED EXAMPLES

In the semiconductor laser 30 according to the third embodiment described above, the bandgap wavelength of InGaAsP structuring the n-type cladding layer 32 is set to 0.95 μm. However, the present invention is not limited thereto.

However, although in accordance with the optical confinement coefficient to the active layer 14 as well, in the general high power semiconductor laser, if the bandgap wavelength of InGaAsP is made to be greater than 0.97 μm, because the guided light is too strongly affected by the n-type cladding layer 32, a waveguide mode cannot exist.

Therefore, the bandgap wavelength of InGaAsP structuring the n-type cladding layer 32 is preferably made to be less than or equal to 0.97 μm.

Further, in the semiconductor laser 30 according to the third embodiment described above, the width of the active layer 14 is 4.0 μm. However, the present invention is not limited thereto.

Namely, as described above, in the semiconductor laser 30 according to the present invention, because the difference of the refractive indices of the active layer 14 and the n-type cladding layer 32 is smaller than that in the conventional semiconductor laser, the maximum width of the active layer which can suppress a lateral high-order mode can be enlarged so as to be wider than 3.3 μm, which is the width of the active layer of the conventional semiconductor laser. In accordance therewith, there is further the advantage for making laser light have high-power.

Therefore, as the semiconductor laser obtaining high-power light output as described in the present invention, it suffices that the width of the active layer 14 can be enlarged to be at least greater than or equal to 3.5 μm.

Further, the semiconductor light emitting device according to the present invention can be applied to, in addition to the semiconductor lasers in accordance with the respective embodiments described above, in the same way, other semiconductor light emitting devices such as an external resonator type semiconductor laser, a light emitting diode (LED), and the like.

(Advantage of the Invention)

As described above, in the semiconductor light emitting device according to the present invention, the n-type cladding layer is structured from InGaAsP whose refractive index is larger than that of the p-type cladding layer formed from InP.

Therefore, the semiconductor light emitting device according to the present invention can deflect the distribution of light to the n-type cladding layer side with the simple structure, and even when the confinement coefficient of the active layer is lowered, deterioration of light output by intervalence band light absorption at the p-type cladding layer can be prevented, so that high-power light output can be obtained.

Furthermore, in the semiconductor light emitting device according to the present invention, because the refractive index difference of the active layer and the n-type cladding layer is smaller than that of the prior art, the maximum width of the active layer which can suppress a lateral high-order mode can be enlarged, there is further the advantage for making light output have high-power.

Also, in the semiconductor light emitting device according to the present invention, there is no need to increase the thickness of the p-type cladding layer, and there is no concern that the deterioration of light output due to an increase of the value of resistance of element is brought about.

Consequently, according to the present invention, a semiconductor light emitting device which can obtain high-power light output with a simple structure can be provided.

Moreover, according to the present invention, even when the optical confinement coefficient to the active layer is lowered, a semiconductor light emitting device which can obtain high-power light output with a simple structure, and in which it is difficult to generate mode displacement can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light emitting device comprising:

a semiconductor substrate formed from InP;

an active layer which is formed from InGaAsP and provided at an upper side of the semiconductor substrate, and which has a width of not less than 3.5 $\mu$m; and an n-type cladding layer formed from InGaAsP and a p-type cladding layer formed from InP, which hold the active layer therebetween, wherein given that a refractive index of the n-type cladding layer is na, and a refractive index of the p-type cladding layer is nb, a relationship na>nb is satisfied, and wherein a distribution of light generated by the active layer is deflected to the n-type cladding layer side, such that optical loss by intervalence band light absorption at the p-type cladding layer is suppressed.

2. A semiconductor light emitting device according to claim 1, further comprising:

a first SCH (Separate Confinement Heterostructure) layer formed from InGaAsP, which is formed between the active layer and the n-type cladding layer; and a second SCH layer formed from InGaAsP, which is formed between the active layer and the p-type cladding layer.

3. A semiconductor light emitting device according to claim 1, wherein the active layer comprises a plural-layer MQW (Multi-quantum well) structure including plural-layer well layers and plural-layer barrier layers positioned at both sides of the respective well layers.

4. A semiconductor light emitting device according to claim 2, wherein the first SCH layer includes a multilayer structure formed from a plurality of layers, and the second SCH layer includes a multilayer structure formed from a plurality of layers.

5. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nN and t1, t2, t3, . . . , tN, an order increasing from the active layer, and given that respective refractive indices and thicknesses of said plurality of layers of the second SCH layer are n1, n2, n3, . . . , nN and t1, t2, t3, . . . , tN, in an order increasing from the active layer, the thicknesses of the respective layers of both the first and second SCH layers are set to satisfy a relationship:

$$t1=t2=t3=, \ldots, =tN$$

magnitudes of the refractive indices of the respective layers of the active layer, the first SCH layer, the second SCH layer, the n-type cladding layer and the p-type cladding layer is set to satisfy a relationship:

$$ns>n1>n2>n3>, \ldots, nN>na>nb$$

such that the refractive indices of the first and second SCH layers become smaller with increasing distance from the active layer, and differences between the refractive indices of adjacent layers in said plurality of layers respectively structuring the first SCH layer and the second SCH layer are set to satisfy a relationship:

$$ns-n1>n1-n2>n2-n3>, \ldots, >nN-nb>nN-na$$

such that the differences between refractive indices become smaller the with decreasing distance from the corresponding one of the n-type cladding layer and the p-type cladding layer and increasing distance from the active layer.

6. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nM and t1, t2, t3, . . . , tN, an order increasing from the active layer, and given that respective refractive indices and thicknesses of said plurality of layers of the second SCH layer are n1, n2, n3, . . . , nN and t1, t2, t3, . . . , tN, in an order increasing from the active layer, magnitudes of the refractive indices of the respective layers of the active layer, the first SCH layer, the second SCH layer, the n-type cladding layer and the p-type cladding layer is set to satisfy a relationship:

$$ns>n1>n2>n3>, \ldots, nN>na>nb$$

such that the refractive indices of the first and second SCH layers become smaller with increasing distance from the active layer, differences between the refractive indices of adjacent layers in said plurality of layers respectively structuring the first SCH layer and the second SCH layer are set to satisfy a relationship:

$$ns-n1=n1-n2=n2-n3=, \ldots, =nN-nb,$$

where nN−nb>nN−na, and the thicknesses of the respective layers of both the first and second SCH layers are set to satisfy a relationship:

$$t1<t2<t3<, \ldots, <tN$$

such that the thicknesses become larger with increasing distance from the active layer.

7. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nN and t1, t2, t3, . . . , tN, an order increasing from the active layer, and given that respective refractive indices and thicknesses of said plurality of layers of the second SCH layer are n1, n2, n3, . . . , nN and t1, t2, t3, . . . , tN, in an order increasing from the active layer, magnitudes of the refractive indices of the respective layers of the active layer, the first SCH layer, the second SCH layer, the n-type cladding layer and the p-type cladding layer is set to satisfy a relationship:

$$ns>n1>n2>n3>, \ldots, nN>na>nb$$

such that the refractive indices of the first and second SCH layers become smaller with increasing distance from the active layer, differences between the refractive indices of adjacent layers in said plurality of layers respectively structuring the first SCH layer and the second SCH layer are set to satisfy a relationship:

$$ns-n1>n1-n2>n2-n3>, \ldots, >nN-nb>nN-na$$

such that the differences between the refractive indices become smaller with increasing distance from the active layer, and the thicknesses of the respective layers of both the first and second SCH layers are set to satisfy a relationship:

$$t1>t2>t3>, \ldots, >tN$$

such that the thicknesses become larger with increasing distance from the active layer.

8. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nN and t1, t2, t3, . . . , tN, an order increasing from the active layer, and given that respective refractive indices and the thicknesses of said plurality of layers of the second SCH layer are n1, n2, n3, . . . , nN and t1, t2, t3, . . . , tN, in an order increasing from the active layer, the thicknesses of the respective layers of both the first and second SCH layers are set to satisfy a relationship:

$$t1=t2=t3=, \ldots, =tN$$

magnitudes of the refractive indices of the respective layers of the active layer, the first SCH layer, the second SCH layer, the n-type cladding layer and the p-type cladding layer is set to satisfy relationships:

$$ns>n1>n2>n3>, \ldots, nN>nb, \text{ and } na>nN$$

such that the refractive indices of the first and second SCH layers become smaller with increasing distance from the active layer, and differences between the refractive indices of adjacent layers in said plurality of layers respectively structuring the first SCH layer and the second SCH layer are set to satisfy a relationship:

$$ns-n1>n1-n2>n2-n3>, \ldots, >n(N-1)-nN$$

such that the differences between the refractive indices become smaller with decreasing distance from the corresponding one of the n-type cladding layer and the ptype cladding layer and increasing distance from the active layer.

9. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nN and t1, t2, t3, . . . , tN, an order increasing from the active layer, and given that respective refractive indices and thicknesses of said plurality of layers of the second SCH layer are n1, n2, n3, . . . , nN and t1, t2, t3, . . . , tN, in an order increasing from the active layer, magnitudes of the refractive indices of the respective layers of the active layer, the first SCH layer, the second SCH layer, the n-type cladding layer and the p-type cladding layer is set to satisfy relationships:

$$ns>n1>n2>n3>, \ldots, nN>nb, \text{ and } na>nN$$

such that the refractive indices of the first and second SCH layers become smaller with increasing distance from the active layer, differences between the refractive indices of adjacent layers in said plurality of layers respectively structuring the first SCH layer and the second SCH layer are set to satisfy a relationship:

$$ns-n1=n1-n2=n2-n3=, \ldots, =nN-nb,$$

and the thicknesses of the respective layers of both the first and second SCH layers are set to satisfy a relationship:

$$t1<t2<t3<, \ldots, <tN$$

such that the thicknesses become larger with increasing distance from the active layer.

10. A semiconductor light emitting device according to claim 4, wherein, given that a refractive index of a layer having a lowest refractive index in the active layer is ns, given that respective refractive indices and thicknesses of said plurality of layers of the first SCH layer are n1, n2, n3, . . . , nN and t1, t2, t3, . . . , tN, an order increasing from the active layer, and given that respective refractive indices and thicknesses of said plurality of layers of the second SCH layer are n1, n2, n3, . . . , nN and t1, t2, t3, . . . , tN, in an order increasing from the active layer, magnitudes of the refractive indices of the respective layers of the active layer, the first SCH layer, the second SCH layer, the n-type cladding layer and the p-type cladding layer is set to satisfy relationships:

$$ns>n1>n2>n3>, \ldots, nN>nb, \text{ and } na>nN$$

such that the refractive indices of the first and second SCH layers become smaller with increasing distance from the active layer, differences between the refractive indices of adjacent layers in said plurality of layers respectively structuring the first SCH layer and the second SCH layer are set to satisfy a relationship:

$$ns-n1>n1-n2>n2-n3>, \ldots, >n(N-1)-nN$$

such that the differences between the refractive indices become smaller with increasing distance from the active layer, and the thicknesses of the respective layers of both the first and second SCH layers are set to satisfy a relationship:

$$t1<t2<t3<, \ldots, <tN$$

such that the thicknesses become larger with increasing distance from the active layer.

11. A semiconductor light emitting device according to claim 2, wherein the semiconductor light emitting device is formed so as to be a buried structure.

12. A semiconductor light emitting device according to claim 11, wherein the n-type cladding layer, the first SCH layer, the active layer, the second SCH layer, and a part of the p-type cladding layer are formed to be a mesa type, and the semiconductor light emitting device further comprises:

a first buried layer formed from p-type InP such that one surface thereof contacts one of the semiconductor substrate and the n-type cladding layer at both sides of the respective layers formed to be a mesa type; and a second buried layer formed from n-type InP such that one surface thereof contacts the p-type cladding layer and the other surface thereof contacts the other surface of the first buried layer at said both sides of the respective layers formed to be a mesa type.

13. A semiconductor light emitting device according to claim 1, wherein the semiconductor light emitting device is formed so as to be a ridge structure.

14. A semiconductor light emitting device according to claim 13, wherein, when the semiconductor substrate is n-type, the p-type cladding layer comprises a ridge structured portion in which a substantially central portion of an outer side thereof extends outward farther than outer portions thereof, and the semiconductor light emitting device further comprises:

a contact layer formed at an upper side of the ridge structured portion at the p-type cladding layer;

an insulating layer formed so as to expose a central portion of the contact layer, and so as to cover the p-type cladding layer including the ridge structured portion; and an electrode formed at a top portion of the insulating layer such that one portion thereof is connected to the contact layer.

15. A semiconductor light emitting device according to claim 1, wherein a bandgap wavelength of InGaAsp structuring the n-type cladding layer is not more than 0.97 $\mu$m.

16. A semiconductor light emitting device according to claim 1, wherein, when the semiconductor substrate is n-type, the n-type cladding layer is formed at a lower side of the active layer, and the p-type cladding layer is formed at an upper side of the active layer.

17. A semiconductor light emitting device according to claim 1, wherein, when the semiconductor substrate is p-type, the n-type cladding layer is formed at an upper side of the active layer, and the p-type cladding layer is formed at a lower side of the active layer.

* * * * *